United States Patent
Yu et al.

Patent Number: 6,136,679
Date of Patent: Oct. 24, 2000

[54] GATE MICRO-PATTERNING PROCESS

[75] Inventors: Chen-Hwa Yu; Syun-Ming Jang, both of Hsin-Chu, Taiwan

[73] Assignee: Taiwan Semiconductor Manufacturing Company, Hsin-Chu, Taiwan

[21] Appl. No.: 09/261,996

[22] Filed: Mar. 5, 1999

[51] Int. Cl.$^7$ ........................ H01L 21/4763; H01L 21/44
[52] U.S. Cl. .......................... 438/592; 438/671; 438/636; 438/717; 438/711
[58] Field of Search .................................... 438/592, 671, 438/636, 647, 652, 669, 657, 706, 717

[56] References Cited

U.S. PATENT DOCUMENTS

| | | | |
|---|---|---|---|
| 5,219,788 | 6/1993 | Abernathey et al. | 437/187 |
| 5,324,689 | 6/1994 | Yoo | 437/228 |
| 5,326,431 | 7/1994 | Kadomura | 156/659.1 |
| 5,354,713 | 10/1994 | Kim et al. | 437/195 |
| 5,545,588 | 8/1996 | Yoo | 437/187 |
| 5,750,316 | 5/1998 | Kawamura et al. | 430/311 |
| 5,858,621 | 1/1999 | Yu et al. | 430/313 |
| 5,985,517 | 11/1999 | Tanaka et al. | 430/311 |

OTHER PUBLICATIONS

Wolf, "Silicon Processing for the VLSI Era", vol. 2 : Process Integration, Lattice Press, Sunset Beach, CA, (1990) pp. 438–439.

*Primary Examiner*—Charles Bowers
*Assistant Examiner*—Thanh Nguyen
*Attorney, Agent, or Firm*—George O. Saile; Stephen B. Ackerman

[57] ABSTRACT

A new method of forming sub-micron features, such as a gate feature in particular, of less than 0.25 micrometers ($\mu$m) to 0.18 $\mu$m employing a micro-patterning process is disclosed. It is shown that the critical dimension width of a polysilicon gate can be controlled precisely by using very thin lithographic layers in a micro-patterning process. This is accomplished by forming a conductive layer over a gate oxide layer, followed by forming a planarization layer, an anti-reflective coating (ARC), and then, as a key feature, a very thin photoresist layer. A high resolution photoresist mask is next formed without the presence of any reflections in the photoresist layer due to the high optical absorptivity of the ARC, or BARC, at the bottom of the photoresist layer. Then, the precisely formed pattern is successively transferred, by etching, to BARC and to planarization layers which in turn form as second and first hard masks, respectively. In a first embodiment, the thin photoresist layer along with the BARC layer are removed simultaneously with the forming of the gate electrode in the conductive layer. In the second embodiment, the photoresist mask as well as the second hard mask are removed simultaneously with the forming of the gate electrode in the conductive layer.

33 Claims, 5 Drawing Sheets

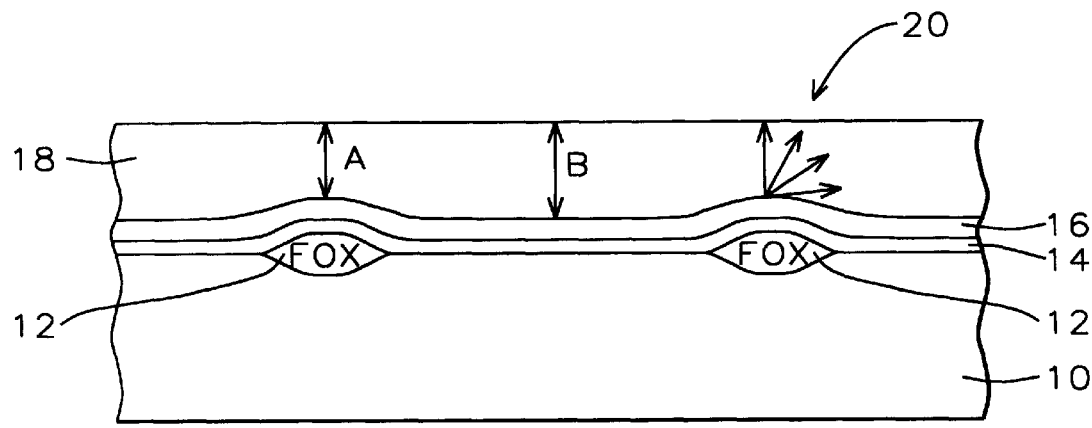
FIG. 1- Prior Art
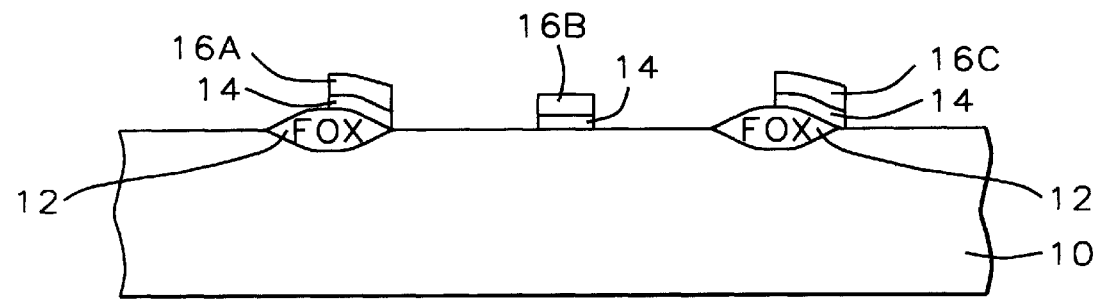
FIG. 2 - Prior Art
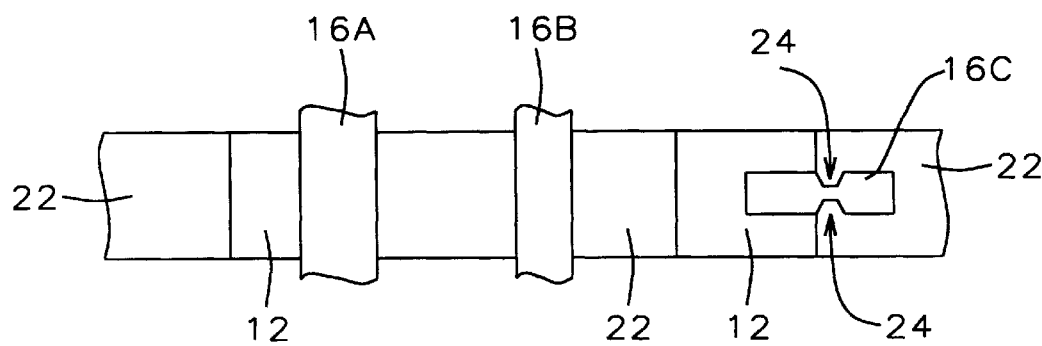
FIG. 3 - Prior Art

GATE MICRO-PATTERNING PROCESS

BACKGROUND OF THE INVENTION (1) Field of the Invention

The present invention relates to a method of forming polysilicon gates, and in particular, to a method of controlling the critical dimension width of a polysilicon gate by using very thin lithographic layers in a micro-patterning process.

(2) Description of the Related Art

Micro-lithography used in the very large (VLSI) or ultra large (ULSI)scaling of integrated circuits requires high dimensional control to produce device feature sizes over the entire wafer surface with high accuracy and precision. A first step in a lithographic process is the forming of a photoresist layer over features on a substrate and then the patterning of the photoresist by exposing it through a photomask. The thickness of the photoresist layer determines to a large extent the resolution required to print minimum size images, and in order to build devices with submicron features, lithographic processes with submicron resolution capabilities are needed. It is disclosed in the present invention a method to form very thin lithographic layers to achieve polysilicon width dimensions less than 0.25 micrometers ($\mu$m) reaching 0.18 $\mu$m using i-line and KrF lithography, respectively.

When a photoresist layer is formed over features on a substrate, its thickness varies across the substrate depending upon the size and geometry of the underlying features. That is, as the resist film crosses over steps or indentations underneath, its much thinner over the top of steps than over regions which are low-lying. During the exposure, either the thin resist becomes overexposed, or the thicker resist underexposed. Upon development, a resist pattern crossing a step will therefore possess a linewidth various (i.e., narrower on the top of the step). For lines in which step heights approach the size of the linewidth (e.g., for sub-micron linewidths), such variations in dimension become intolerable. In addition, standing wave effects in thick resist layers reduces their minimum resolution. Finally, reflective substrates also degrade resolution in thick resist films. (See Wolf, S., and Tauber, R. N. "Silicon Processing for the VLSI Era," vol. 2, Lattice Press, Sunset Beach, Calif., 1990, pp.438–439).

Such dimensional variation effects caused by substrate topography can be seen in prior art. FIG. 1 shows a portion of a partially completed integrated circuit in which there is a silicon substrate (10). Field oxide regions (12) are formed in and on the silicon substrate resulting in a uneven topography of the top surface of the substrate. A gate oxide layer (14) is grown on the surface of the substrate and the field oxide regions. A layer of polysilicon (16) is deposited over the gate oxide layer. A layer of photoresist (18) covers the surface of the substrate and planarizes the substrate. It will be apparent to those skilled in the art that the differing photoresist depths A and B will make an imperfect image and resulting imperfect image and resulting mask, causing critical dimension variation. Due to the standing-wave phenomenon, different resist thicknesses result in different resist dimensions; this is known as the swing-effect. Also, the polysilicon on the sloped edge of the field oxide region reflects light (20) during photolithographic exposure, resulting in necking.

FIG. 2 shows the integrated circuit chip after photolithography and etching with completed polysilicon lines (16A), (16B), and (16C). FIG. 3 shows a top view of FIG. 2, including field oxide regions (12), active areas (22), and polysilicon lines (16A), (16B), and (16C). The mask used has the same dimensions for polysilicon lines (16A) and (16B), but different dimensions are printed on the photoresist mask because of the different photoresist thicknesses on the topography. Resulting polysilicon line (16A) has a different dimension than polysilicon line (16B) because of the photoresist thickness difference (A) and (B) in FIG. 1 due to different elevations. This figure also illustrates the necking problem (24) in polysilicon line (16C), especially for areas having a large change in topography such as the field oxide to active areas. This necking problem could result in early breakdown of the integrated circuit via the neck, (24).

U.S. Pat. No. 5,324,689 to Yoo shows a method of critical dimension control with a planarized underlayer. The mask comprises: polysilicon/spin-on-glass (SOG)layer/ photoresist. The photoresist layer is exposed through the desired mask, developed and patterned to form the desired resist mask. The exposed SOG and polysilicon are removed by etch. The photoresist mask is stripped. The SOG layer remaining over the polysilicon patterned layer is removed, resulting in the polysilicon layer having the desired uniform critical dimension. In another U.S. Pat. No. 5,45,588, Yoo also shows a method of using a disposable hard mask for gate dimension control.

Abernathy, on the other hand, in U.S. Pat. No. 5,219,788, uses bilayer metallization cap for photolithography. The first layer is an antireflective coating such as titanium nitride applied to the metal. The second layer is a barrier comprising silicon such as sputtered silicon or $SiO_2$. The barrier layer may also be a thin coating of SOG. The barrier layer prevents interaction between the titanium nitride and acid groups which are generated during exposure of the resist. With this structure in place the resist is applied, exposed and developed. Kim, in U.S. Pat. No. 5,354,713 shows a method of a contact of a multi-layered metal line of a highly integrated semiconductor device. The insulating layer between the metal lines is flattened an step coverage is improved by using a SOG layer or polyimide. This invention discloses a different micro-patterning process where thin multiple masks are used in order to achieve tighter control on dimensions so as to be able to form features of sizes less than 0.25 micrometers ($\mu$m) to 0.18 $\mu$m.

SUMMARY OF THE INVENTION

It is therefore an object of this invention to provide a new micro-patterning process for forming a polysilicon gate.

It is another object of this invention to provide a method of controlling the critical dimension width of a polysilicon gate by using very thin lithographic layers in a micro-patterning process.

it is an over-all object of the present invention to provide a method of forming sub-micron features of less than 0.25 micrometers ($\mu$m) to 0.18 $\mu$m. These objects are accomplished by providing a semiconductor substrate having active and passive regions defined therein; forming a gate oxide layer over said substrate; forming a conducting layer over said gate oxide layer; covering said conducting layer with a planarization layer wherein said planarization layer planarizes the surface of said substrate and also serves as a first hard mask; forming a bottom anti-reflective coating (BARC) layer over the surface of said planarization layer wherein said BARC layer also serves as a second hard mask; forming a thin photoresist layer over said BARC layer; exposing said thin photoresist layer to actinic light where said BARC layer prevents reflection of said actinic light from its surface and developing and patterning said thin photoresist layer with a gate pattern for said gate electrode to form a photoresist mask for forming said gate in said conducting layer; etching said BARC layer using said photoresist mask to form said second hard mask having said gate pattern in said BARC layer; etching said planarization layer using said second hard mask to form said first hard mask having said gate pattern in said planarization layer while simultaneously removing said photoresist mask; etching said conducting layer using said first hard mask having said gate pattern in said planarization layer to form said gate electrode in said conducting layer while simultaneously removing said second hard mask in said BARC layer; and removing said planarization layer to complete the forming of said gate electrode.

In a second embodiment, the photoresist mask as well as the second hard mask are removed simultaneously with the forming of the gate electrode in the conductive layer.

BRIEF DESCRIPTION OF THE DRAWINGS

FIGS. 1 and 2 schematically illustrate in cross-sectional representation a process of the prior art.

FIG. 3 schematically illustrates in to-view representation some drawbacks of the prior art process.

DESCRIPTION OF THE PREFERRED EMBODIMENTS

Figure 2A:
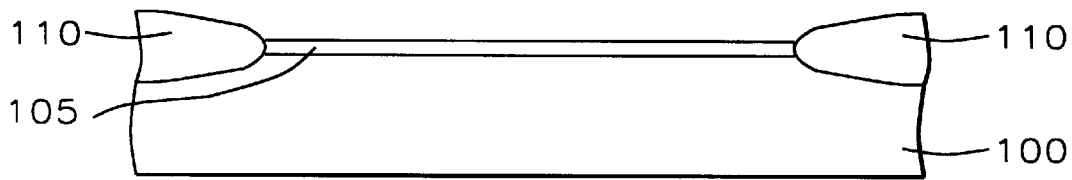
FIG. 2a is a partial cross-sectional view of a semiconductor substrate showing the growing of gate oxide after the forming of field oxide in accordance with this invention.

Referring now to the drawings, in particular to FIGS. 2a–2m, there are shown schematically steps of forming sub-micron features of less than 0.25 micrometers ($\mu$m) to 0.18 $\mu$m employing a micro-patterning process which will now be described. Though the method is applicable to controlling dimensions of features in general, the description will be directed to the controlled forming of gates and gate electrodes in integrated circuits. The method is accomplished by widening the photoprocessing window through decreasing the thickness of the photoresist mask- which contains the image of the gate- and in turn is formed over a planarized surface. It will be appreciated by those in the art that both aspects, namely, a thinner photomask as well as the underlying planarized surface will provide improvement in the resolution required to form ever shrinking device features of the VLSI and ULSI technologies while using existing photolithography tools.

Thus, in FIG. 2a, semiconductor substrate (100), preferably silicon, is provided with active and passive regions, which are well known in the art. It will be noted that field oxide regions (110) formed as is conventional in the art providing an uneven topography over the surface of the substrate.

Figure 2B:
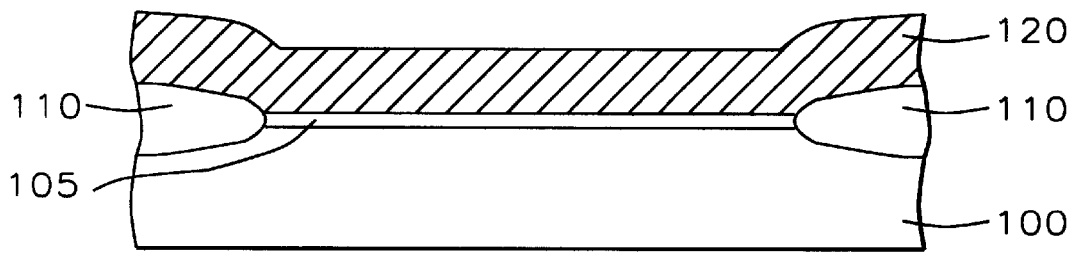
FIG. 2b is a partial cross-sectional view of the semiconductor substrate of FIG. 2a where, in accordance with the present invention, the forming of a conductive layer is shown.

A layer of gate oxide (105) is thermally grown on the substrate at a temperature between about 600 to 1100° C., and to a thickness between about 200 to 120 angstroms (Å). A polycrystalline silicon (polysilicon) layer (120) is next deposited over the gate oxide layer as shown in FIG. 2b. Polysilicon is formed through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 525 to 620° C. As an alternative, polycide may also be formed over the gate oxide by a simultaneous evaporation of polysilicon and a metal selected from a refractory group consisting of tungsten, titanium, tantalum, molybdenum, and platinum, preferably, titanium.

Figure 2C:
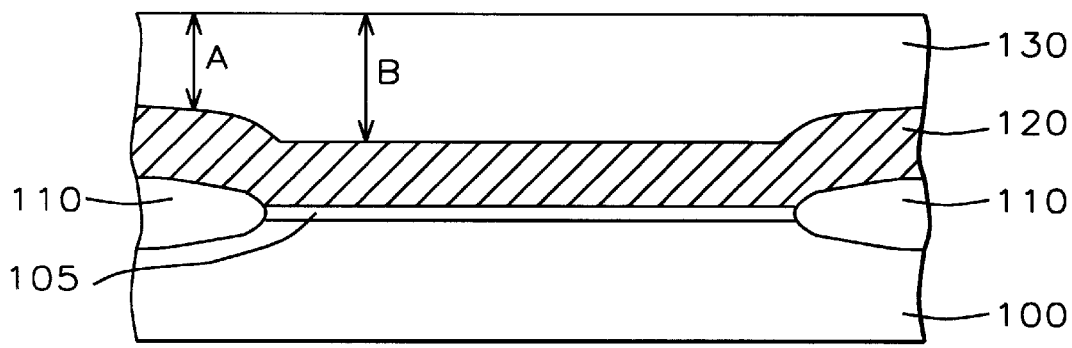
FIG. 2c is a partial cross-sectional view of the semiconductor substrate of FIG. 2b where, in accordance with the present invention, the forming of a planarization layer is shown.
Figure 2D:
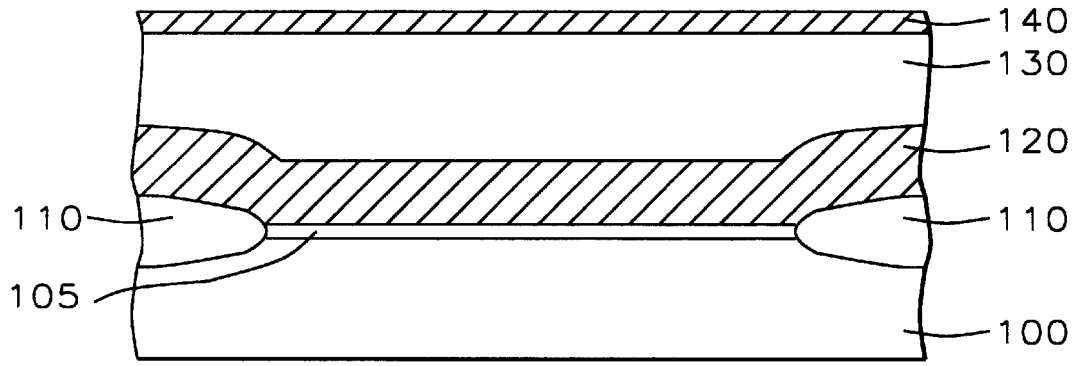
FIG. 2d is a partial cross-sectional view of the semiconductor substrate of FIG. 2c where, in accordance with the present invention, the forming of an anti-reflective coating (ARC) is shown.

Next, referring to FIG. 2c, planarization layer (130) is deposited over the polysilicon or polycide layer (120) The dielectric planarization layer can be phosphosilicate glass (PSG), borophosphosilicate (BPSG), or a combination of BPSG and tetraethoxysilane (TEOS), but BPSG is preferred. These dielectrics may be deposited by CVD or plasma-enhanced (PE)-CVD to a preferred thickness between about 2,500 to 3,500 Å. Then the dielectric is subjected to a temperature between about 850 to 950° C. to anneal and reflow the glass and to planarize the top surface of the semiconductor surface. The BPSG layer fills in the indentations of the uneven topography on the surface of the substrate wafer thus providing the smooth base on which the subsequent lithographic layers will be formed. This can be seen in FIG. 2c where the uneven thicknesses (A) and (B) are now confined within BPSG layer (130) so that the subsequent layers in which feature patterned masks will be formed will have uniform thicknesses without any distortions that would in turn distort critical dimensions, such as that of the gate electrode that is to be formed. It will be noted that other planarization materials, such as a spin-on-glass (SOG) material, either a silicate or a siloxane, may also be spun in a conventional manner over the polysilicon or polycide layer (120) to provide planarized, smooth topography as seen in FIG. 2c.

Next, and as an important step, an anti-reflective coating (ARC), layer (140), is deposited over planarized layer (130) with a thickness between about 150 to 1500 Å. This is performed prior to the deposition of photoresist layer so that when the photoresist is exposed to actinic light the combination layers will be optically more absorptive. As is well known, reflections in a photoresist cause variations in the dimensions of the image to be patterned with the attendant reliability problems associated with the resulting features.

One type of ARC is an organic film which is highly absorbing and non-bleaching at the exposure wavelength. It is applied directly to the substrate to a thickness of ~0.5 $\mu$m, and resist is spun on top of it. When applied below the photoresist layer, the ARC is referred to as a bottom-ARC or BARC. As a result, the BARC absorbs most of the radiation that penetrates the resist. Standing wave effects are substantially reduced, as there is much less reflection off of the underlying layer. Scattering from topographical features is also suppressed. In addition, the BARC partially planarizes the wafer topography, further helping to improve feature variation over steps, since the resist thickness is more uniform. It is preferred in the present invention that BARC layer (140) is formed over an already planarized layer (130), as described above, so that the resulting surface is optically very flat so as to assure the precise patterning of sub-micron features as small as 0.18 $\mu$m. Other anti-reflective materials such as titanium, titanium nitride or amorphous silicon may also be sputter deposited and used as BARC.

Figure 2E:
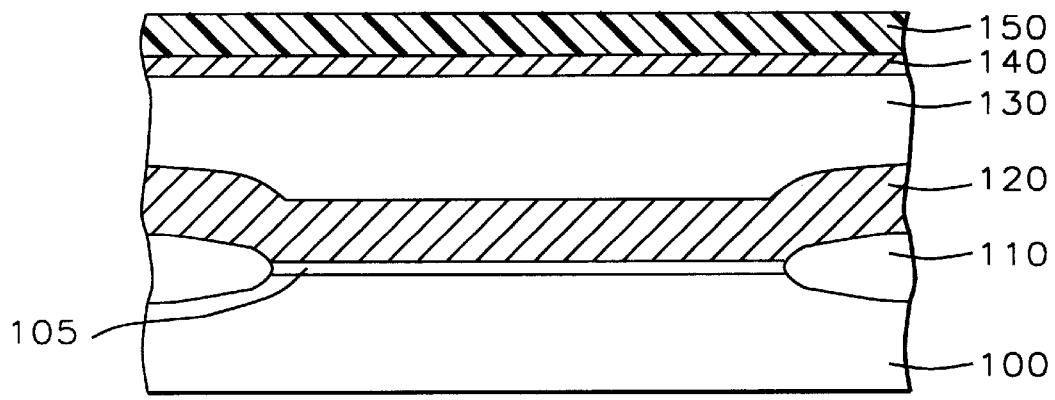
FIG. 2e is a partial cross-sectional view of the semiconductor substrate of FIG. 2d where, in accordance with the present invention, the forming of a thin photoresist layer is shown.
Figure 2F:
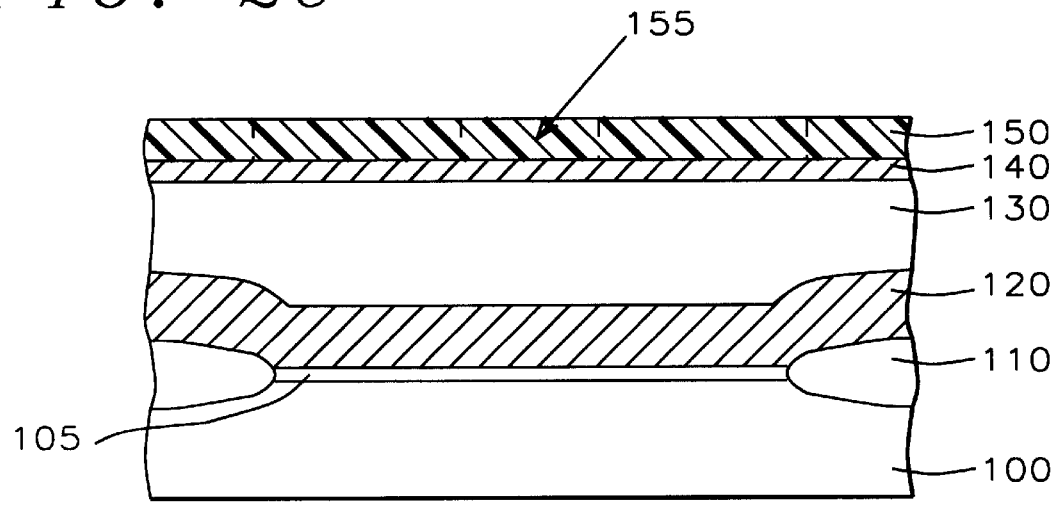
FIG. 2f is a partial cross-sectional view of the semiconductor substrate of FIG. 2e where, in accordance with the present invention, the patterning of the thin photoresist layer is shown.
Figure 2G:
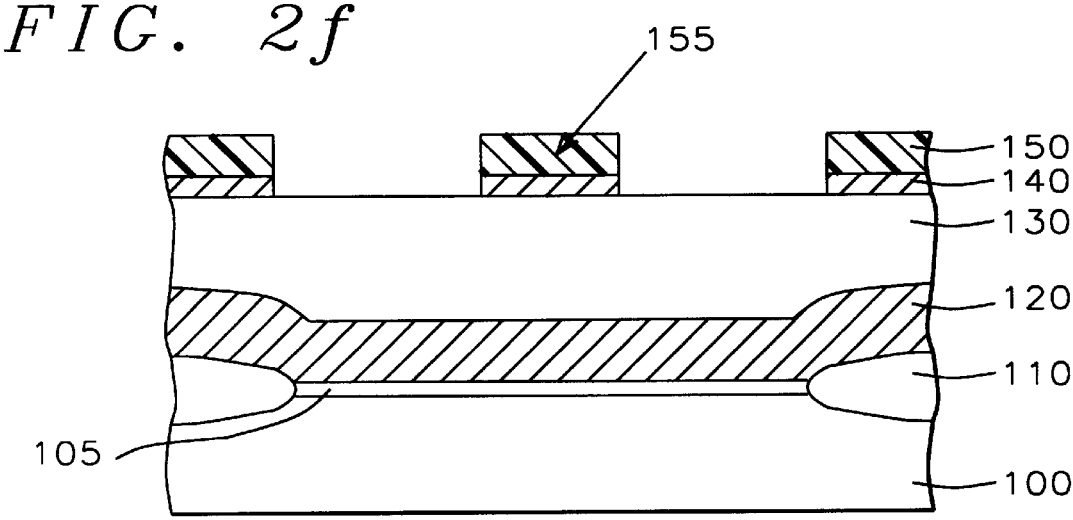
FIG. 2g is a partial cross-sectional view of the semiconductor substrate of FIG. 2f where, in accordance with the present invention, the forming of the second hard mask in the ARC(BARC) layer is shown.

As a main feature and key aspect of the present invention, a very thin layer of photoresist (150) is next formed over BARC layer (140) as shown in FIG. 2e. The preferred thickness is between about 1000 to 2000 Å. Then the photoresist layer is exposed and high resolution patterns (155) are formed in the thin layer as shown in FIG. 2f. These patterns, in turn, are precisely transferred into the underlying BARC layer, (140), forming a hard mask, designated as second hard mask shown in FIG. 2g. This is accomplished by using an etch recipe comprising $O_2$, $Cl_2$, $BCl_3$ and He.

Figure 2H:
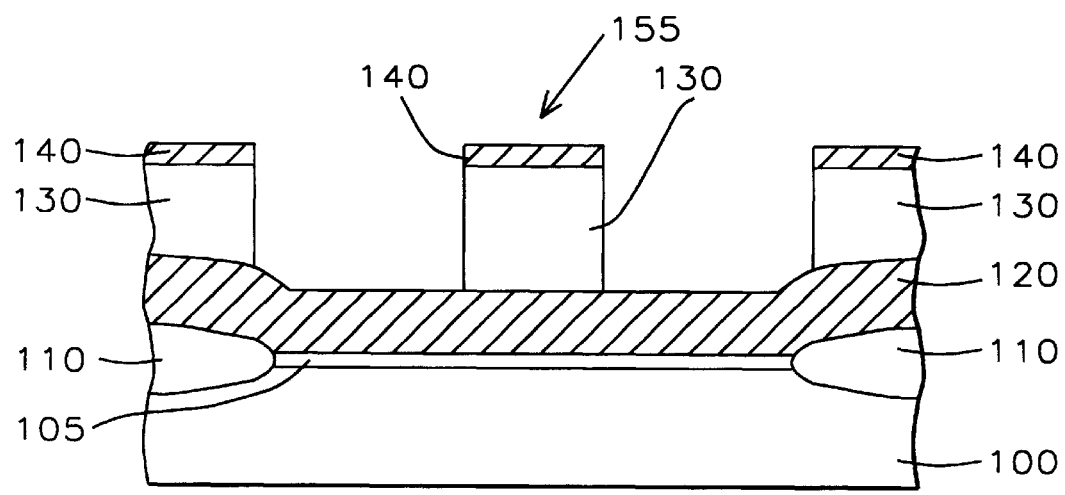
FIG. 2h is a partial cross-sectional view of the semiconductor substrate of FIG. 2g where, in accordance with the present invention, the forming of the first hard mask in the planarization layer is shown.
Figure 2I:
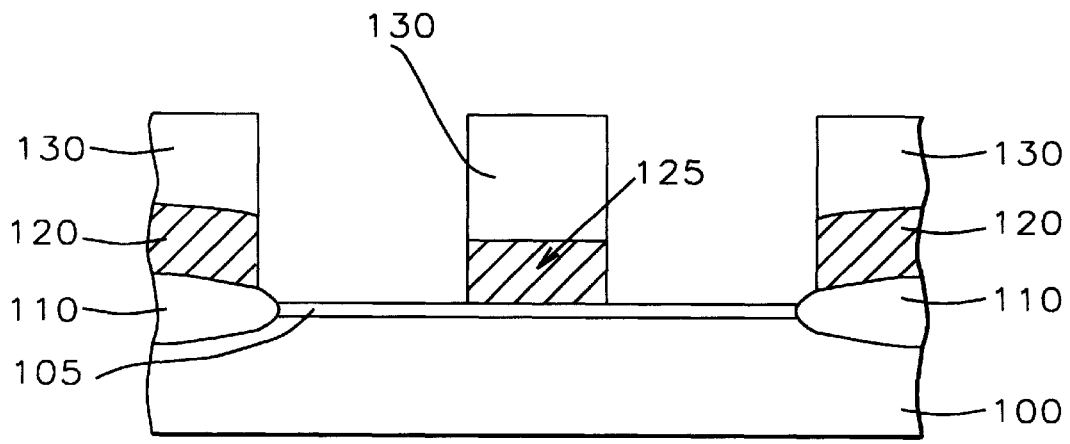
FIG. 2i is a partial cross-sectional view of the semiconductor substrate of FIG. 2h where, in accordance with the present invention, the forming of a conductive gate and simultaneous removal of the photoresist mask and the second hard mask are shown.
Figure 2J:
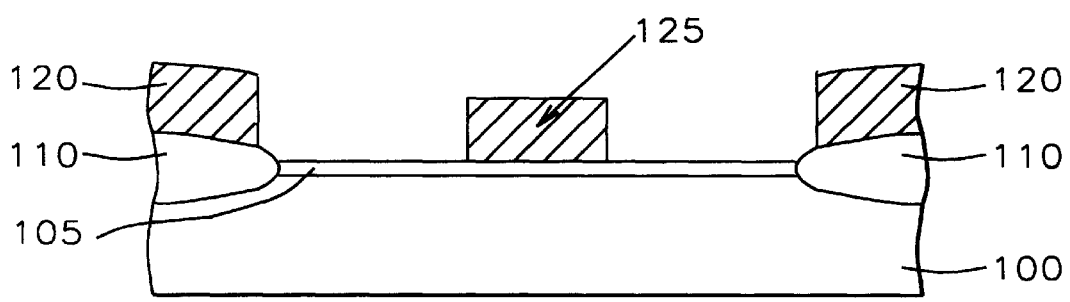
FIG. 2j is a partial cross-sectional view of the semiconductor substrate of FIG. 2i which shows the final structure of the gate formed using the micro-patterning process of this invention.

In the first embodiment depicted in FIG. 2h, pattern (155) is further transferred into layer (130) while at the same time removing the thin layer of photoresist mask (150). This is accomplished with a recipe comprising $O_2$, $N_2$, and $C_xH_yF_8$. The hard mask formed in this planarization layer is designated as first hard mask. It will be appreciated by those skilled in the art that, the first hard mask so formed in layer (130) is very precise because it has been transferred from a high resolution photoresist mask, and then from a precision hard mask formed in BARC layer (140), or the second hard mask. At the next step, shown in FIG. 2i, conductive layer (120) is patterned with the image of the gate electrode patterned in the first hard mask to form the precisely defined gate, (125), of this invention using the new micro-process described heretofore. It is another key aspect of the present invention that the second hard mask in the BARC layer is removed at the same time the pattern is transferred from the first hard mask in the planarization layer into the conductive layer. The planarization layer is subsequently removed as shown in FIG. 2j. The etching of the polygate and the removal of the planarization layer are accomplished with recipes comprising respectively, $O_2$, $Cl_2$, $BCl_3$, He, and $O_2$, $N_2$, and $C_xH_yF_8$ or wet HF.

Figure 2K:
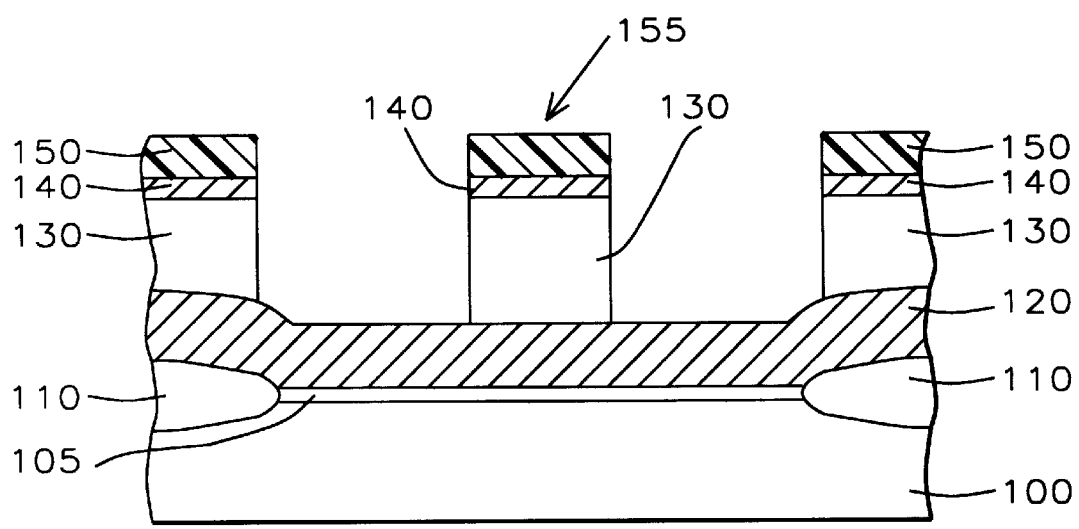
FIG. 2k shows a second embodiment of the present invention where the BARC and planarization layers of the first embodiment of FIG. 2f are etched continuously to form second and first hard masks, respectively, according to this invention.
Figure 2L:
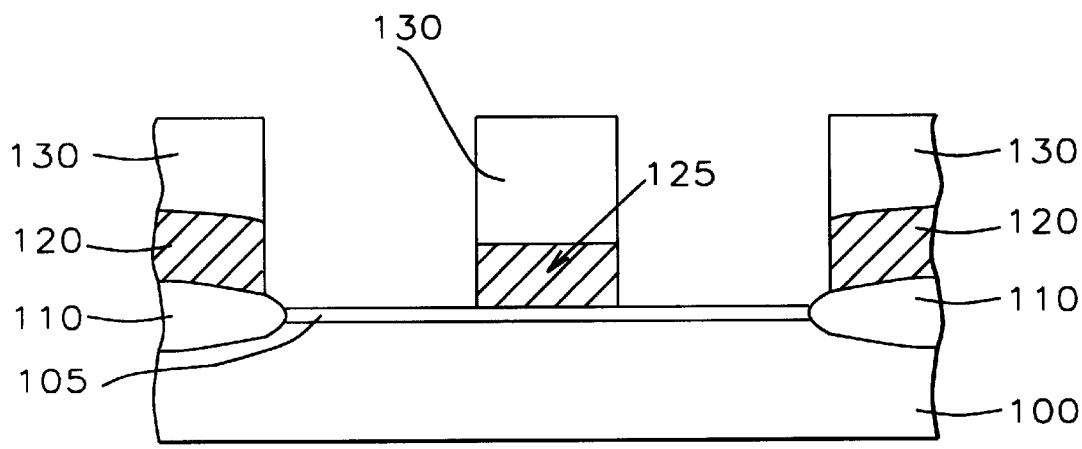
FIG. 2l is a partial cross-sectional view of the semiconductor substrate of FIG. 2k where, in accordance with the present invention, the forming of a conductive gate and simultaneous removal of the photoresist mask and the second hard mask are shown, and is the same as the process step in FIG. 2i.
Figure 2M:
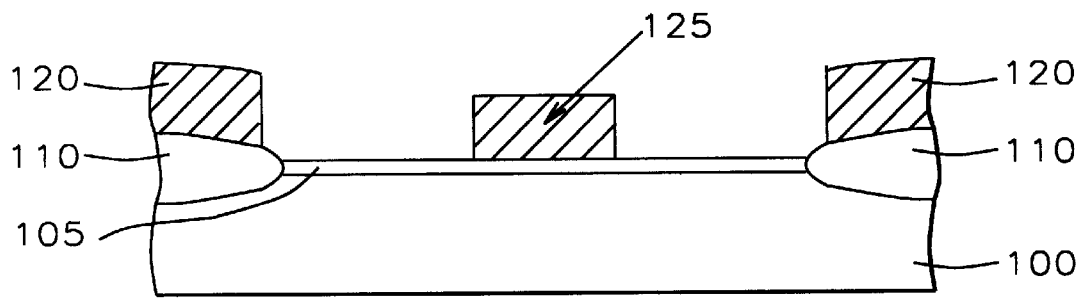
FIG. 2m is a partial cross-sectional view of the semiconductor substrate of FIG. 2l which shows the final structure of the gate formed using the second embodiment of the micro-patterning process of this invention, and depicts the same process step as that of FIG. 2j.

In a second embodiment, the second and first hard masks are formed by etching through the BARC and planarization layers continuously using the high resolution photoresist mask a shown in FIG. 2k. This is accomplished with an etch recipe comprising $O_2$+Ar for BARC and $O_2$+$C_xH_yF_8$ for the planarization layer. Then, the photoresist mask and the second hard mask in the BARC, layers (150) and (140), respectively, are removed together at the same time that the gate pattern is transferred from the second hard mask in layer (130) into conductive layer (120) resulting in a structure shown in FIG. 2l which is the same as FIG. 2i. The etching of the conductive layer, and the removal of the photoresist layer along with the BARC layer is accomplished with an etch recipe comprising $O_2$+$Cl_2$+$HBr_3$. Finally, planarization layer (130) containing the first hard mask is removed by using and etch recipe comprising $C_xH_yF_8$ (e.g., $CHF_3$, or $CH_3F$), or $C_4F_8$), or wet dip in HF. The resulting structure is as shown in FIG. 2m which is the same as FIG. 2j of the first embodiment; that is, the same dimensionally precision controlled polygate formed employing the disclosed micro-patterning process of this invention.

While the invention has been particularly shown and described with reference to the preferred embodiments thereof, it will be understood by those skilled in the art that various changes in form and details may be made without departing from the spirit and scope of the invention.

What is claimed is:

1. A method of forming a gate electrode by using very thin lithographic layers in a micro-patterning process comprising the steps of:

provide a semiconductor substrate having active and passive regions defined therein;

forming a gate oxide layer over said substrate;

forming a conducting layer over said gate oxide layer;

covering said conducting layer with a planarization layer wherein said planarization layer planarizes the surface of said substrate and also serves as a first hard mask;

forming a bottom anti-reflective coating (BARC) layer over the surface of said planarization layer wherein said BARC layer also serves as a second hard mask;

forming a thin photoresist layer over said BARC layer;

exposing said thin photoresist layer to actinic light where said BARC layer prevents reflection of said actinic light from its surface and developing and patterning said thin photoresist layer with a gate pattern for said gate photoresist layer with a gate pattern for said gate electrode to form a photoresist mask for forming said gate in said conducting layer;

etching said BARC layer using said photoresist mask to form said second hard mask having said gate pattern in said BARC layer;

etching said planarization layer using said second hard mask to form said first hard mask having said gate pattern in said planarization layer while simultaneously removing said photoresist mask;

etching said conducting layer using said first hard mask having said gate pattern in said planarization layer to form said gate electrode in said conducting layer while simultaneously removing said second hard mask in said BARC layer; and removing said planarization layer to complete the forming of said gate electrode.

2. The method of claim 1, wherein said gate oxide has a thickness between about 100 to 120 angstroms (Å).

3. The method of claim 1, wherein said conducting layer comprises polysilicon having a thickness between about 1,500 to 4,500 Å.

4. The method of claim 1, wherein said conducting layer comprises polysilicon having a thickness between about 1,500 to 4,500 Å.

5. The method of claim 1, wherein said planarization layer comprises borophosphosilicate glass (BPSG) deposited to a thickness between about 2,500 to 3,500 Å and subjected to an annealing temperature between about 850 to 950° C.

6. The method of claim 1, wherein said planarization layer comprises spin-on-glass (SOG) coated to a thickness between about 2,500 to 4,500 Å.

7. The method of claim 6, wherein said SOG material is silicate or siloxane.

8. The method of claim 6, wherein said SOG material is baked at a temperature between about 220 and 440° C. for between about 20 to 50 minutes.

9. The method of claim 1, wherein said BARC layer comprises an organic material deposited to a thickness between about 150 to 1500 Å.

10. The method of claim 1, wherein said BARC layer comprises amorphous silicon sputter deposited to a thickness between about 150 to 1500 Å.

11. The method of claim 1, wherein said BARC layer comprises titanium or titanium nitride sputter deposited to a thickness between about 150 to 1500 Å.

12. The method of claim 1, wherein said thin photoresist layer has a thickness between about 1,000 to 2,000 Å.

13. The method of claim 1, wherein said etching said BARC layer to form said second hard mask is accomplished with a recipe comprising $O_2$, $Cl_2$, $BCl_3$ and He.

14. The method of claim 1, wherein said etching said planarization layer to form said first hard mask while simultaneously removing said thin photoresist layer is accomplished with a recipe comprising $O_2$, $N_2$, and $C_xH_yF_8$.

15. The method of claim 1, wherein said etching said conducting layer to form said gate electrode of said micro-patterning process while simultaneously removing said second hard mask in said BARC layer is accomplished with a recipe comprising $O_2$, $Cl_2$, $BCl_3$ and He followed by $O_2+C_xH_yF_8$.

16. The method of claim 1, wherein said removing said planarization layer to complete the forming of said gate electrode is accomplished by using a recipe comprising $C_xH_yF_8$.

17. A method of forming a polygate electrode by using very thin lithographic layers in a micro-patterning process comprising the steps of:

providing a semiconductor substrate having active and passive regions defined therein;

forming a gate oxide layer over said substrate;

forming a polysilicon layer over said gate oxide layer;

covering said polysilicon layer with a spin-on-glass (SOG) layer wherein said SOG layer planarizes the surface of said substrate and also serves as a hard mask;

forming a bottom anti-reflective coating (BARC) layer over the surface of said planarization layer wherein said BARC layer prevents reflection of actinic light from its surface;

forming a thin photoresist layer over said BARC layer;

exposing said thin photoresist layer to actinic light where said BARC layer prevents reflection of said actinic light from its surface and developing and patterning said thin photoresist layer with a gate pattern of said gate electrode to form a photoresist mask for forming said gate in said polysilicon layer;

etching said BARC layer and said SOG layer not covered by said photoresist mask to form said hard mask having said gate pattern; and etching said polysilicon layer using said hard mask having said gate pattern to form said polygate electrode in said polysilicon layer while simultaneously removing said thin photoresist layer and BARC layer;

removing said planarization layer to complete the forming of said gate electrode.

18. The method of claim 17, wherein said gate oxide has a thickness between about 100 to 120 angstroms (Å).

19. The method of claim 17, wherein said polysilicon layer has a thickness between about 1,500 to 4,500 Å.

20. The method of claim 17, wherein said (SOG) material is silicate or siloxane.

21. The method of claim 19, wherein said SOG material is baked at a temperature between about 220 and 440° C. for between about 20 to 50 minutes.

22. The method of claim 17, wherein said (SOG) layer has a thickness between about 2,500 to 4,500 Å.

23. The method of claim 17, wherein said BARC layer comprises an organic material deposited to a thickness between about 150 to 1500 Å.

24. The method of claim 17, wherein said BARC layer comprises amorphous silicon sputter deposited to a thickness between about 150 to 1500 Å.

25. The method of claim 17, wherein said BARC layer comprises titanium or titanium nitride sputter deposited to a thickness between about 150 to 1500 Å.

26. The method of claim 17, wherein said thin photoresist layer has a thickness between about 1,000 to 2,000 Å.

27. The method of claim 17, wherein said etching said BARC layer and said SOG layer to form said hard mask is accomplished with a recipe comprising $O_2$, $Cl_2$, $BCl_3$ and He.

28. The method of claim 17, wherein said etching said conducting layer to form said gate electrode while simultaneously removing said thin photoresist layer and BARC layer is accomplished with a recipe comprising $O_2$, $Cl_2$, $BCl_3$ and He followed by $O_2+C_xH_yF_8$.

29. The method of claim 17, wherein said removing said planarization layer to complete the forming of said gate electrode is accomplished by using a recipe comprising $C_xH_yF_8$.

30. A method of forming a polycide gate electrode by using very thin lithographic layers in a micro-patterning process comprising the steps of:

providing a semiconductor substrate having active and passive regions defined therein;

forming a gate oxide layer over said substrate;

forming a polycide layer over said gate oxide layer;

forming a spin-on-glass (SOG) layer over said polycide layer;

forming an anti-reflective coating (ARC) layer over said SOG layer;

forming a thin photoresist layer over said ARC layer;

patterning said thin photoresist layer to form a photoresist mask having a pattern of said polycide gate;

etching said ARC layer to form a first hard mask having said pattern of said polycide gate;

etching said SOG layer using said first hard mask to form second hard mask having a pattern of said polycide gate while simultaneously removing said thin photoresist layer; and etching said polycide layer using said second hard mask to form said polycide gate electrode in said polycide layer while simultaneously removing said ARC layer.

31. The method of claim 30, wherein the thickness of said thin photoresist layer is between about 1000 to 2000 Å.

32. The method of claim 30, wherein the thickness of said ARC layer is between about 150 to 1500 Å.

33. The method of claim 30, wherein the thickness of said SOG layer is between about 2500 to 3500 Å.

* * * * *